(12) United States Patent
Lin et al.

(10) Patent No.: US 10,388,647 B1
(45) Date of Patent: Aug. 20, 2019

(54) TRANSIENT VOLTAGE SUPPRESSION DEVICE

(71) Applicant: AMAZING MICROELECTRONIC CORP., New Taipei (TW)

(72) Inventors: Kun-Hsien Lin, Hsinchu (TW); Zi-Ping Chen, New Taipei (TW); Che-Hao Chuang, Hsinchu County (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 16/105,318

(22) Filed: Aug. 20, 2018

(51) Int. Cl.
| | |
|---|---|
| H01L 29/74 | (2006.01) |
| H01L 31/111 | (2006.01) |
| H01L 27/02 | (2006.01) |
| H01L 23/528 | (2006.01) |
| H01L 27/06 | (2006.01) |
| H01L 29/861 | (2006.01) |
| H01L 29/735 | (2006.01) |

(52) U.S. Cl.
CPC ...... *H01L 27/0248* (2013.01); *H01L 23/5286* (2013.01); *H01L 27/0647* (2013.01); *H01L 29/735* (2013.01); *H01L 29/74* (2013.01); *H01L 29/8611* (2013.01)

(58) Field of Classification Search
CPC ............. H01L 23/5286; H01L 27/0647; H01L 27/0248; H01L 27/0255; H01L 27/0262; H01L 29/74; H01L 29/7424; H01L 29/87; H01L 23/60; H01L 23/62; H01L 29/083
USPC .................. 257/146, 149, 175, 665
See application file for complete search history.

(56) References Cited

U.S. PATENT DOCUMENTS

| | | | |
|---|---|---|---|
| 2002/0117682 A1* | 8/2002 | Vande Voorde | ............................ H01L 27/14681 257/149 |
| 2018/0226788 A1* | 8/2018 | Salcedo | .............. H01L 27/0262 |

OTHER PUBLICATIONS

Ming-Dou Ker, Shue-Chang Liu; Whole-Chip ESD Protection Design for Submicron CMOS VLSI; IEEE International Symposium on Circuits and Systems, Jun. 9-12, 1997, Hong Kong, pp. 1920-1923.

* cited by examiner

*Primary Examiner* — Kimberly N Rizkallah
*Assistant Examiner* — Dilinh P Nguyen
(74) *Attorney, Agent, or Firm* — Rosenberg, Klein & Lee (57) ABSTRACT

An improved transient voltage suppression device includes a semiconductor substrate, a transient voltage suppressor, at least one first diode, at least one conductive pad, and at least one second diode. The transient voltage suppressor has an N-type heavily-doped clamping area. The first anode of the first diode is electrically connected to the N-type heavily-doped clamping area. The conductive pad is electrically connected to the first cathode of the first diode. The second anode of the second diode is electrically connected to the conductive pad and the second cathode of the second diode is electrically connected to the transient voltage suppressor. The first anode is closer to the N-type heavily-doped clamping area rather than the conductive pad. The conductive pad is closer to the N-type heavily-doped clamping area rather than the second anode.

12 Claims, 9 Drawing Sheets

TRANSIENT VOLTAGE SUPPRESSION DEVICE

BACKGROUND OF THE INVENTION

Field of the Invention

The present invention relates to a suppression device, particularly to an improved transient voltage suppression device.

Description of the Related Art

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages.

Figure 1:
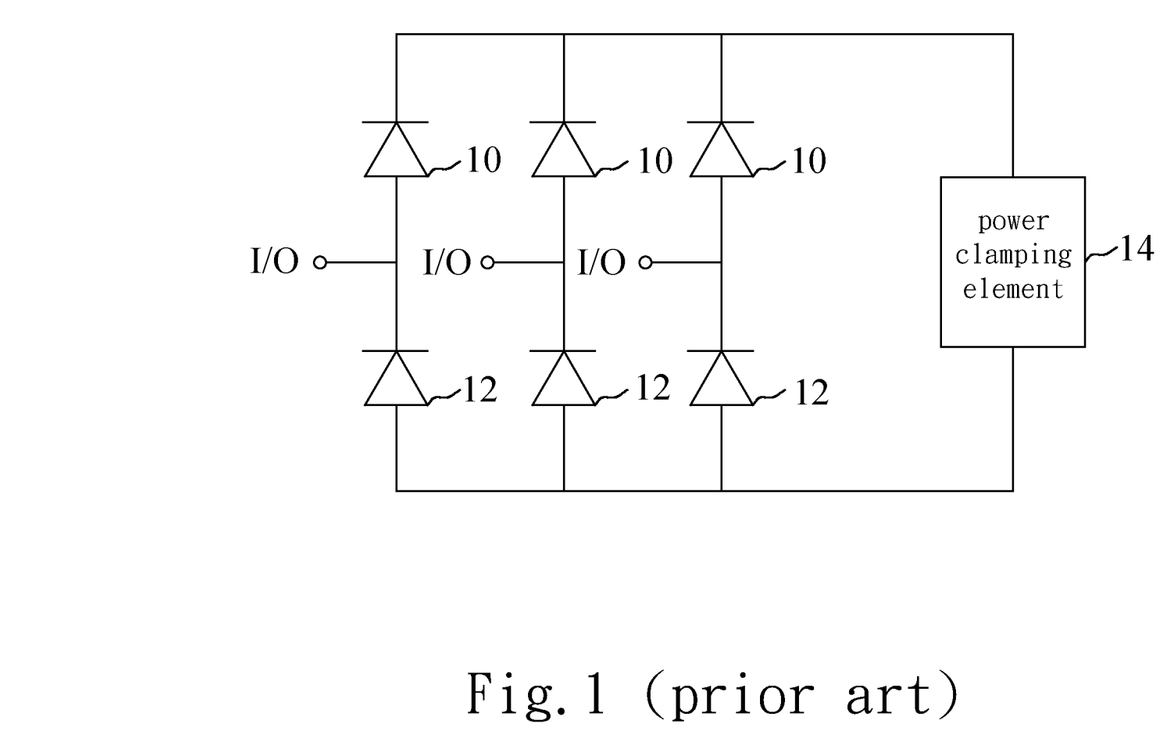
FIG. 1 is a schematic diagram illustrating a transient voltage suppression circuit in the conventional technology.
Figure 2:
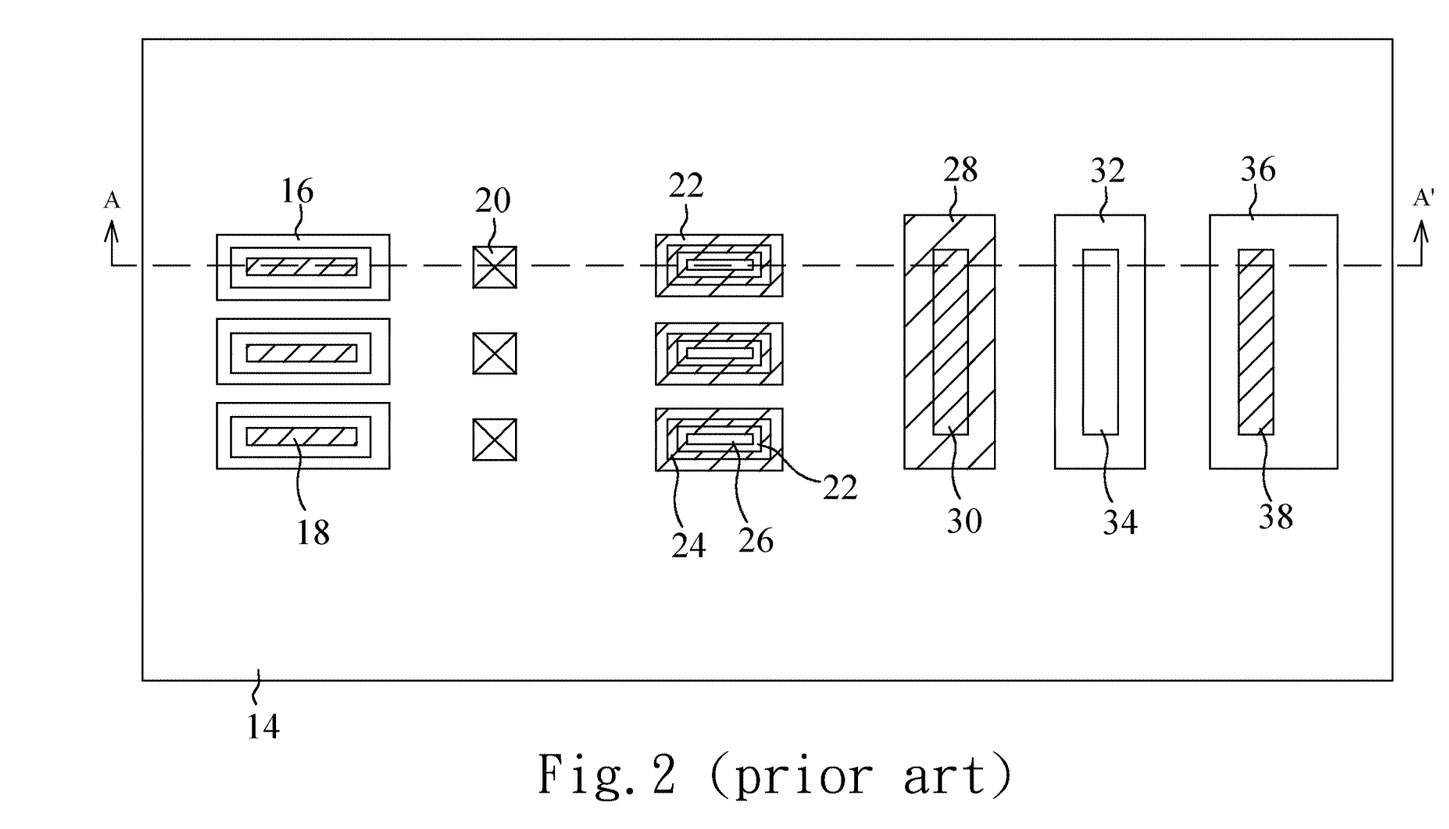
FIG. 2 is a layout schematically showing the transient voltage suppression circuit of FIG. 1.
Figure 3:
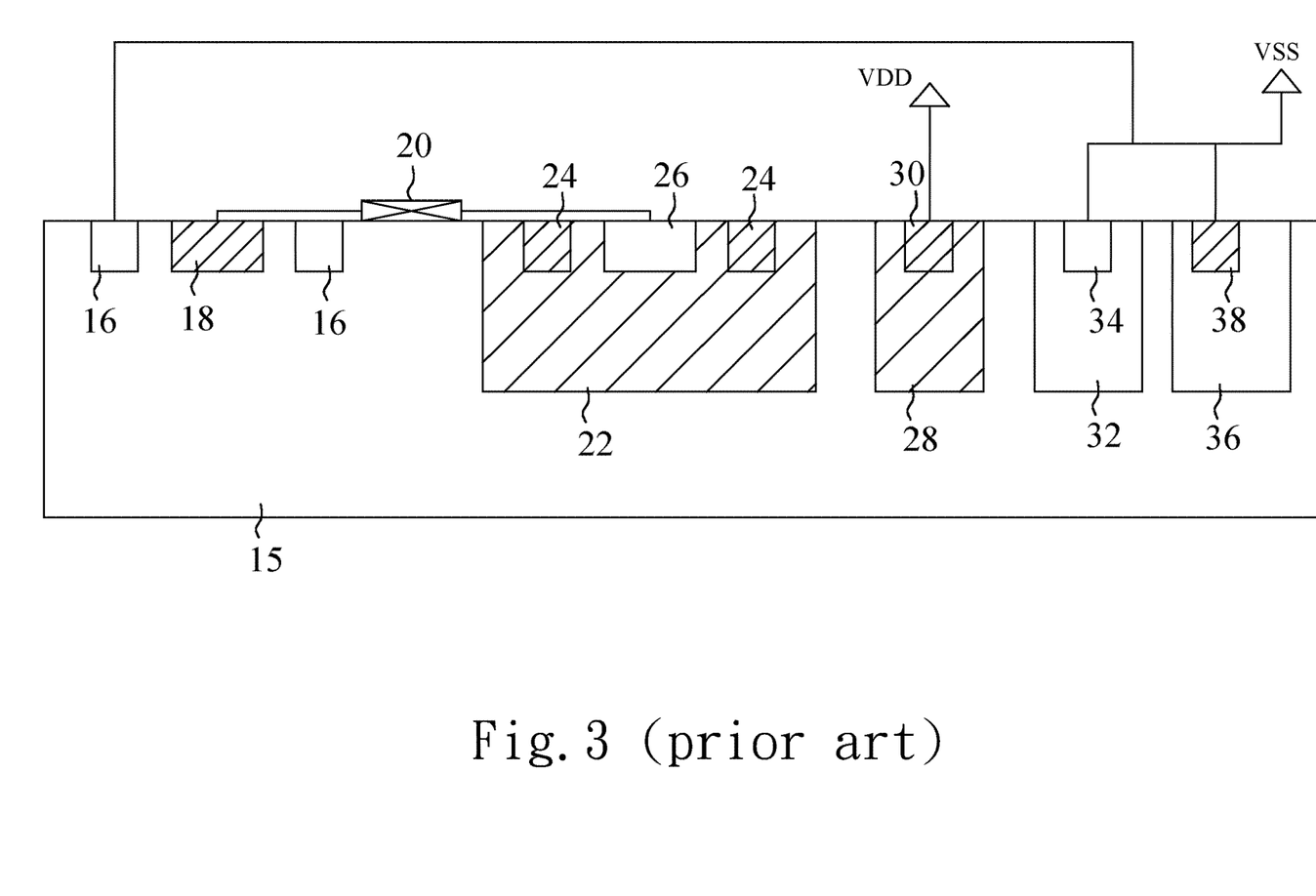
FIG. 3 is a sectional view taken along Line A-A' of FIG. 2.

In general, the transient voltage suppression circuit is shown in FIG. 1. In FIG. 1, the transient voltage suppression circuit includes three first diodes 10, three second diodes 12, and a power clamping element 14, wherein the power clamping element may be a bipolar junction transistor (BJT) or a silicon-controlled rectifier (SCR). The discharging current flows through the first diode 10 and the power clamping element 14 when a positive pulse appears at an I/O port. The discharging current flows through the second diode 12 when a negative pulse appears at an I/O port. Refer to FIG. 1, FIG. 2, and FIG. 3. The transient voltage suppression circuit includes a P-type substrate 15, three P-type heavily-doped areas 16, three N-type heavily-doped areas 18, three conductive pads 20, three N-type wells 22, three N-type heavily-doped areas 24, three P-type heavily-doped areas 26, an N-type well 28, an N-type heavily-doped area 30, a P-type well 32, a P-type heavily-doped area 34, a P-type well 36, and an N-type heavily-doped area 38. The first diodes 10 are formed by the N-type well 22, the N-type heavily-doped area 24, the P-type heavily-doped areas 26. The second diodes 12 are formed by the P-type substrate 15, the P-type heavily-doped area 16, and the N-type heavily-doped areas 18. The power clamping element 14 has the P-type well 36 and the N-type heavily-doped area 38. The N-type well 28, the N-type heavily-doped area 30, the P-type well 32, and the P-type heavily-doped area 34 form a guard ring. The conductive pads 20 are used as the I/O ports. The N-type heavily-doped area 30 is coupled to a high voltage terminal VDD. The N-type heavily-doped area 24 is coupled to the power clamping element 14. The conductive pads 20 are respectively coupled to the N-type heavily-doped areas 18 and respectively coupled to the P-type heavily-doped areas 26. The P-type heavily-doped area 16 and the N-type heavily-doped area 38 are coupled to a low voltage terminal VSS. In order to shorten a conductive trace that connects the first diode 10 to the power clamping element 14, the first diode 10 is closer to the power clamping element 14 rather than the second diode 12, thereby reducing the impedance of the ESD discharging path of the conductive trace and the clamping voltage. However, in order to avoid the latch-up problem, the guard ring is arranged between the first diode 10 and the power clamping element 14 and occupies a large area. When the N-type heavily-doped area 30 is floating, the effect of the guard ring is worst and the latch-up event easily occurs. In other words, the N-type heavily-doped area 30 has to connect to the high voltage terminal VDD. Nevertheless, considering other requirements, the N-type heavily-doped area 30 cannot sometimes connect to the high voltage terminal VDD.

To overcome the abovementioned problems, the present invention provides an improved transient voltage suppression device, so as to solve the afore-mentioned problems of the prior art.

SUMMARY OF THE INVENTION

A primary objective of the present invention is to provide an improved transient voltage suppression device, which uses a second diode to separate a first diode from a transient voltage suppressor without using a guard ring, thereby reducing the layout area, increasing the latch-up path and avoiding the latch-up event.

To achieve the abovementioned objectives, the present invention provides an improved transient voltage suppression device, which comprises a semiconductor substrate, a transient voltage suppressor, at least one first diode, at least one conductive pad, and at least one second diode. The transient voltage suppressor is formed in the semiconductor substrate, the transient voltage suppressor has a P-type clamping region and an N-type heavily-doped clamping area therein, and the N-type heavily-doped clamping area is grounded. The first diode is formed in the semiconductor substrate, the first anode of the first diode is grounded and electrically connected to the N-type heavily-doped clamping area, and the first anode is a first shortest distance from the N-type heavily-doped clamping area. The conductive pad is formed on the semiconductor substrate and electrically connected to the first cathode of the first diode, the conductive pad is a second shortest distance from the N-type heavily-doped clamping area, and the second shortest distance is larger than the first shortest distance. The second diode is formed in the semiconductor substrate, the second anode of the second diode is electrically connected to the conductive pad, the second cathode of the second diode is electrically connected to the transient voltage suppressor, the second anode is a third shortest distance from the N-type heavily-doped clamping area, and the third shortest distance is larger than the second shortest distance.

In an embodiment of the present invention, the semiconductor substrate is an N-type substrate, the P-type clamping region is a P-type well, the at least one first diode further comprises a P-type well, a first N-type heavily-doped area, and a first P-type heavily-doped area, and the at least one second diode further comprises a second N-type heavily-doped area and a second P-type heavily-doped area. The P-type well is formed in the semiconductor substrate. The first N-type heavily-doped area is formed in the P-type well and used as the first cathode. The first P-type heavily-doped area is formed in the P-type well and used as the first anode. The second N-type heavily-doped area is formed in the semiconductor substrate and used as the second cathode. The second P-type heavily-doped area is formed in the semiconductor substrate and used as the second anode.

In an embodiment of the present invention, the semiconductor substrate is a P-type substrate, a part of the semiconductor substrate is used as the P-type clamping region, the at least one first diode further comprises a first N-type heavily-doped area and a first P-type heavily-doped area, and the at least one second diode further comprises an N-type well, a second N-type heavily-doped area, and a second P-type heavily-doped area. The first N-type heavily-doped area is formed in the semiconductor substrate and used as the first cathode. The first P-type heavily-doped area is formed in the semiconductor substrate and used as the first anode. The N-type well is formed in the semiconductor substrate. The second N-type heavily-doped area is formed in the N-type well and used as the second cathode. The second P-type heavily-doped area is formed in the N-type well and used as the second anode.

In an embodiment of the present invention, the second cathode is electrically connected to the transient voltage suppressor through two power buses and the power buses are arranged along the perimeter of the semiconductor substrate. Each of the power buses has a width of at least 20 μm.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 4:
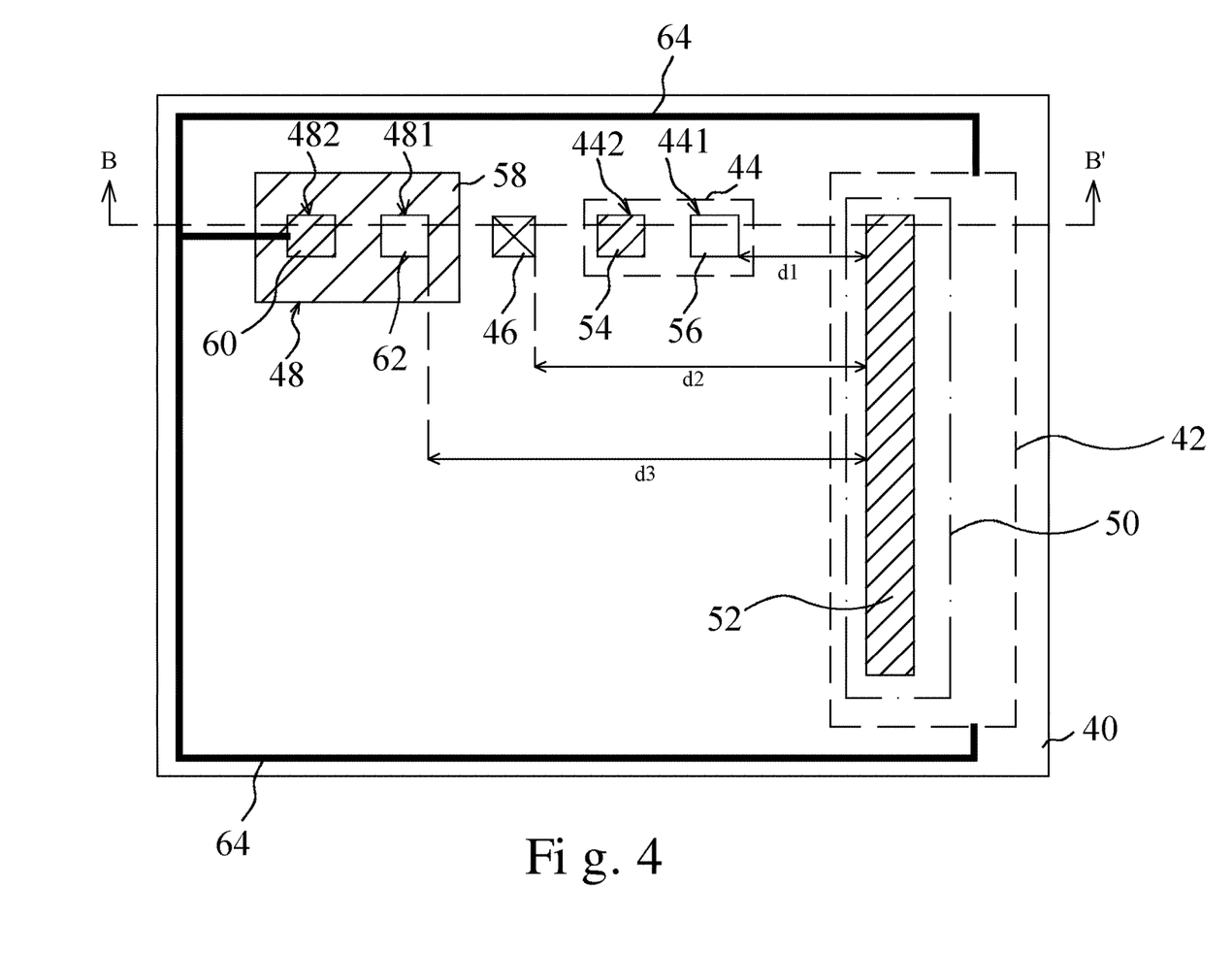
FIG. 4 is a layout schematically showing an improved transient voltage suppression device according to the first embodiment of the present invention.
Figure 5:
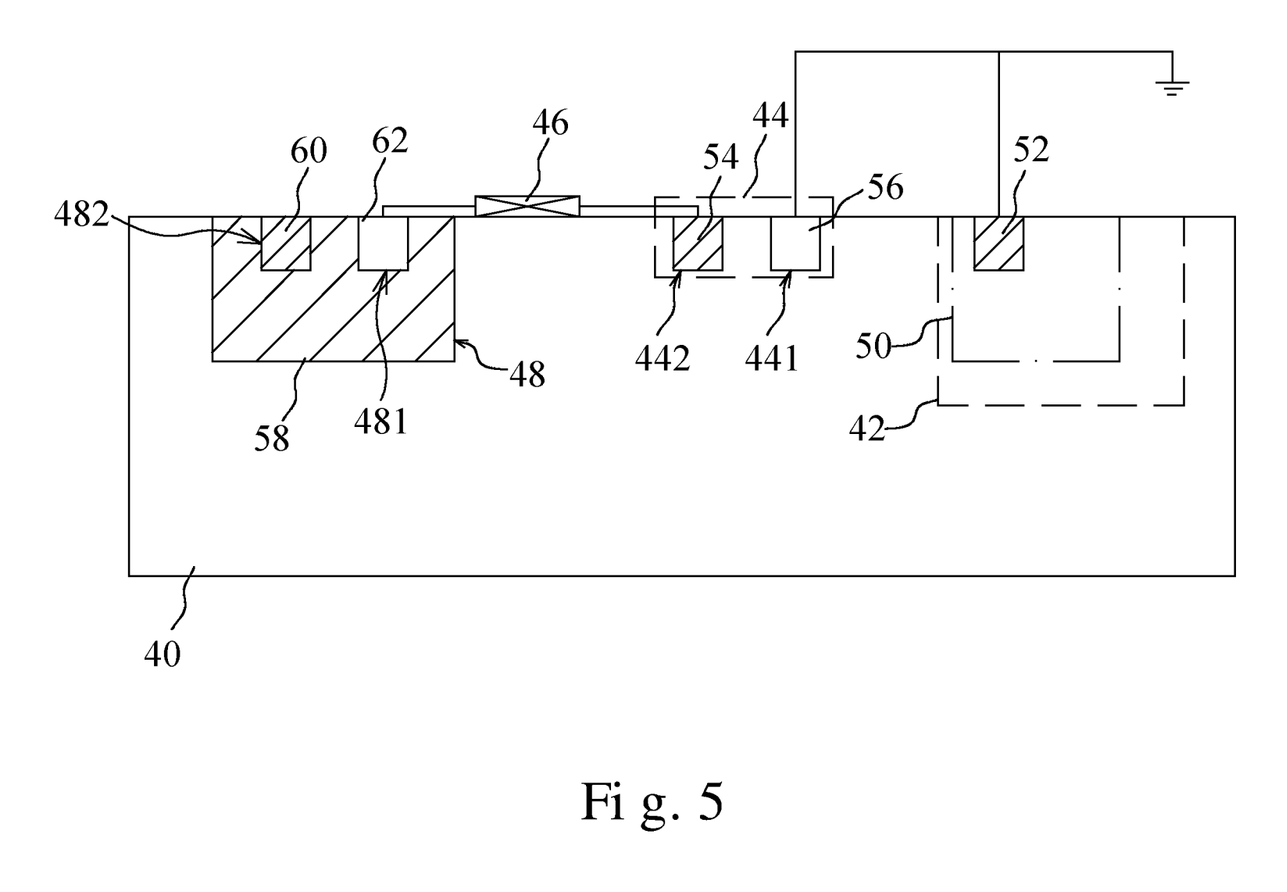
FIG. 5 is a sectional view taken along Line B-B' of FIG. 4.

Refer to FIG. 4 and FIG. 5. The first embodiment of the improved transient voltage suppression device of the present invention is introduced as follows. The improved transient voltage suppression device comprises a semiconductor substrate 40, a transient voltage suppressor 42, at least one first diode 44, at least one conductive pad 46, and at least one second diode 48. In the first embodiment, there are one first diode 44, one conductive pad 46, and one second diode 48. The transient voltage suppressor 42 is formed in the semiconductor substrate 40, the transient voltage suppressor 42 has a P-type clamping region 50 and an N-type heavily-doped clamping area 52 therein, and the N-type heavily-doped clamping area 52 is grounded. For example, the transient voltage suppressor 42 may be a silicon-controlled rectifier or a bipolar junction transistor (BJT). The first diode 44 is formed in the semiconductor substrate 40, the first anode 441 of the first diode 44 is grounded and electrically connected to the N-type heavily-doped clamping area 52, and the first anode 441 is a first shortest distance d1 from the N-type heavily-doped clamping area 52. The conductive pad 46 is formed on the semiconductor substrate 40 and electrically connected to the first cathode 442 of the first diode 44, the conductive pad 46 is a second shortest distance d2 from the N-type heavily-doped clamping area 52, and the second shortest distance d2 is larger than the first shortest distance d1. The second diode 48 is formed in the semiconductor substrate 40, the second anode 481 of the second diode 48 is electrically connected to the conductive pad 46, the second cathode 482 of the second diode 48 is electrically connected to the transient voltage suppressor 42, the second anode 481 is a third shortest distance d3 from the N-type heavily-doped clamping area 52, and the third shortest distance d3 is larger than the second shortest distance d2.

Specifically, the semiconductor substrate 40 is a P-type substrate, a part of the semiconductor substrate 40 is used as the P-type clamping region 50, the first diode 44 further comprises a first N-type heavily-doped area 54 and a first P-type heavily-doped area 56, and the second diode 48 further comprises an N-type well 58, a second N-type heavily-doped area 60, and a second P-type heavily-doped area 62. The first N-type heavily-doped area 54 is formed in the semiconductor substrate 40 and used as the first cathode 442. The first P-type heavily-doped area 56 is formed in the semiconductor substrate 40 and used as the first anode 441. The N-type well 58 is formed in the semiconductor substrate 40. The second N-type heavily-doped area 60 is formed in the N-type well 58 and used as the second cathode 482. The second P-type heavily-doped area 62 is formed in the N-type well 58 and used as the second anode 481. The second cathode 482 of the second diode 48 is electrically connected to the transient voltage suppressor 42 through two power buses 64 and the power buses 64 are arranged along the perimeter of the semiconductor substrate 40. For example, when the transient voltage suppressor 42 is an NPN BJT, the second cathode 482 of the second diode 48 is electrically connected to the N-type heavily-doped area (not shown) of the transient voltage suppressor 42 through the power buses 64. When the transient voltage suppressor 42 is a SCR, the second cathode 482 of the second diode 48 is electrically connected to the P-type heavily-doped area (not shown) of the transient voltage suppressor 42 through the power buses 64. In addition, each of the power buses 64 has a width of at least 20 μm. This way, the clamping voltage and the discharging path corresponding to the second diode 48 of the improved transient voltage suppression device can be reduced. In the first embodiment, the first diode 44 and the conductive pad 46 separate the second anode 481 of the second diode 48 from the N-type heavily-doped clamping area 52, so as to increase the latch-up path, whereby the parasitic component is not easily triggered on to avoid the latch-up event. Due to the fact that the latch-up event does not occur, the conventional guard ring can be removed and a high voltage terminal can be not used. In addition, since the semiconductor substrate 40 is grounded through the first anode 441 of the first diode 44, the semiconductor substrate 40 functions like a guard ring to save the area of a layout.

Figure 6:
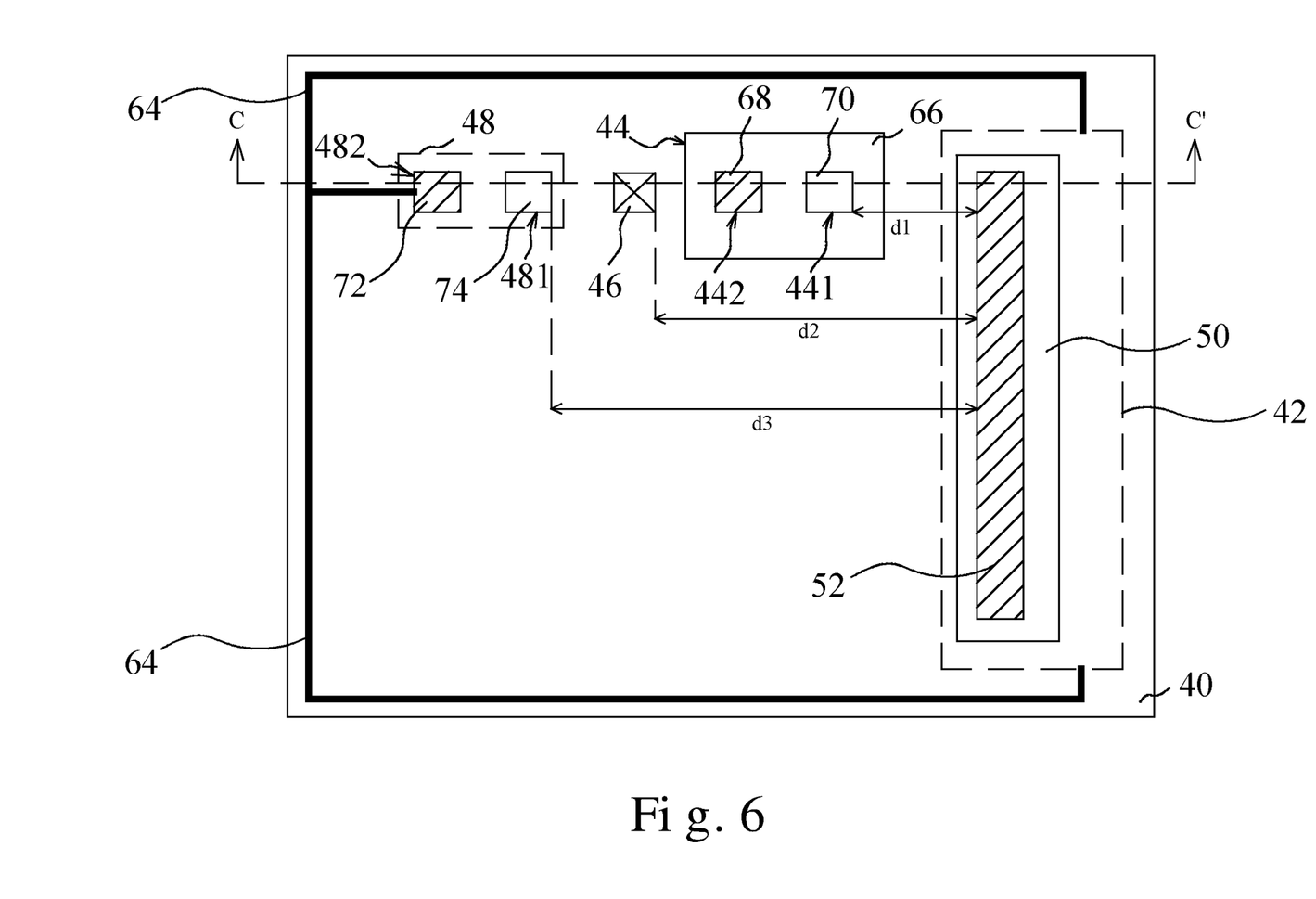
FIG. 6 is a layout schematically showing an improved transient voltage suppression device according to the second embodiment of the present invention.
Figure 7:
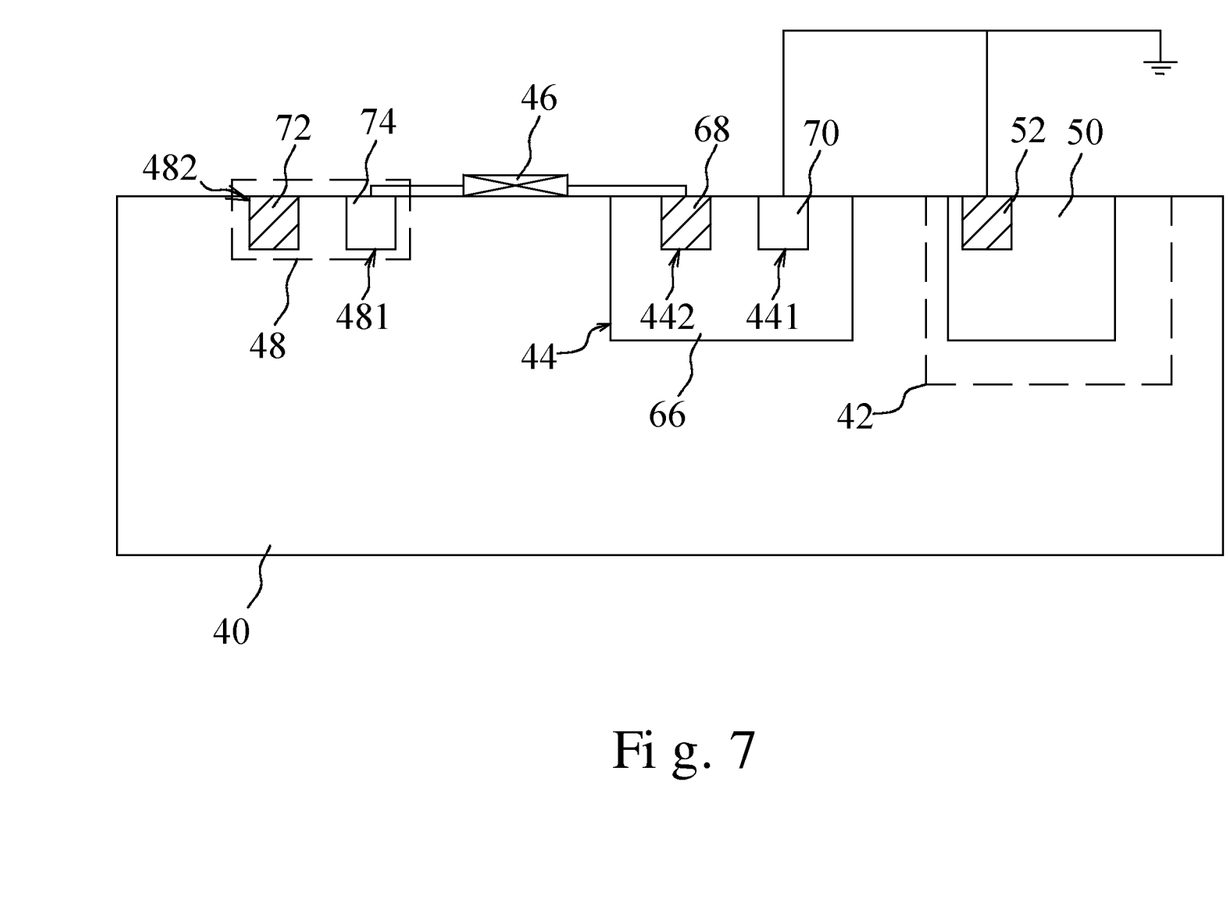
FIG. 7 is a sectional view taken along Line C-C' of FIG. 6.

Refer to FIG. 6 and FIG. 7. The second embodiment of the improved transient voltage suppression device of the present invention is introduced as follows. The second embodiment is different from the first embodiment in the semiconductor substrate 40, the first diode 44 and the second diode 48. In the second embodiment, the semiconductor substrate 40 is an N-type substrate, the P-type clamping region 50 is a P-type well, the first diode 44 further comprises a P-type well 66, a first N-type heavily-doped area 68, and a first P-type heavily-doped area 70, and the second diode 48 further comprises a second N-type heavily-doped area 72 and a second P-type heavily-doped area 74. The P-type well 66 is formed in the semiconductor substrate 40. The first N-type heavily-doped area 68 is formed in the P-type well 66 and used as the first cathode 442. The first P-type heavily-doped area 70 is formed in the P-type well 66 and used as the first anode 441. The second N-type heavily-doped area 72 is formed in the semiconductor substrate 40 and used as the second cathode 482. The second P-type heavily-doped area 74 is formed in the semiconductor substrate 40 and used as the second anode 481. In the second embodiment, the first diode 44 and the conductive pad 46 separate the second anode 481 of the second diode 48 from the N-type heavily-doped clamping area 52, so as to increase the latch-up path, whereby the parasitic component is not easily triggered on to avoid the latch-up event. Due to the fact that the latch-up event does not occur, the conventional guard ring can be removed and a high voltage terminal can be not used. In addition, since the P-type well 66 is grounded through the first anode 441 of the first diode 44, the P-type well 66 functions like a guard ring to save the area of a layout.

Figure 8:
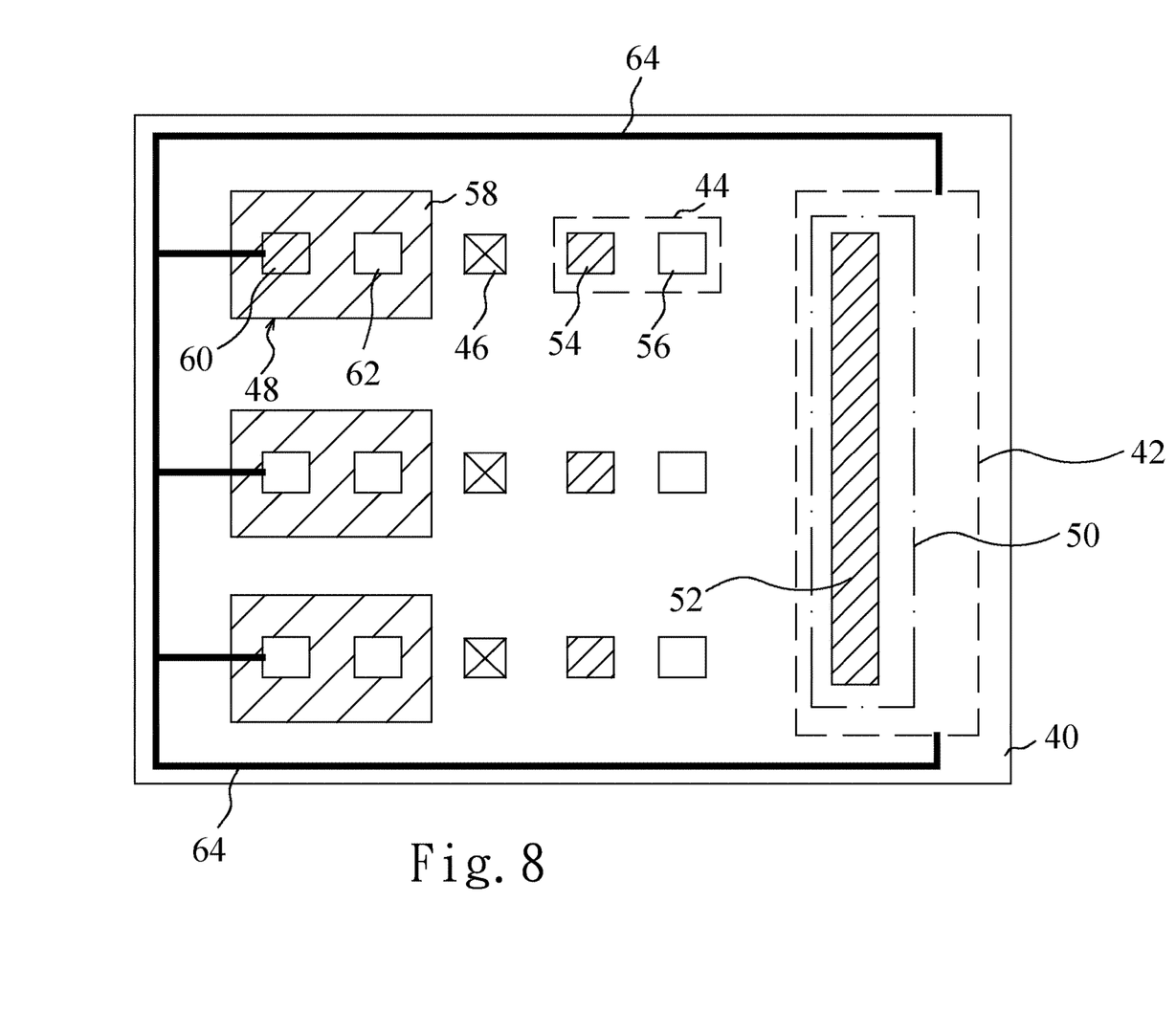
FIG. 8 is a layout schematically showing an improved transient voltage suppression device according to the third embodiment of the present invention.

Refer to FIG. 8. The third embodiment of the improved transient voltage suppression device of the present invention is introduced as follows. The third embodiment is different from the first embodiment in the numbers of the first diode 44, the conductive pad 46, and the second diode 48. In the third embodiment, there are a plurality of first diodes 44, a plurality of conductive pads 46, and a plurality of second diodes 48. Besides, the position of one of the plurality of conductive pads 46 corresponds to the positions of one of the plurality of first diodes 44 and one of the plurality of second diodes 48. Each of the plurality of second diodes 48 is electrically connected with the power buses 64.

Figure 9:
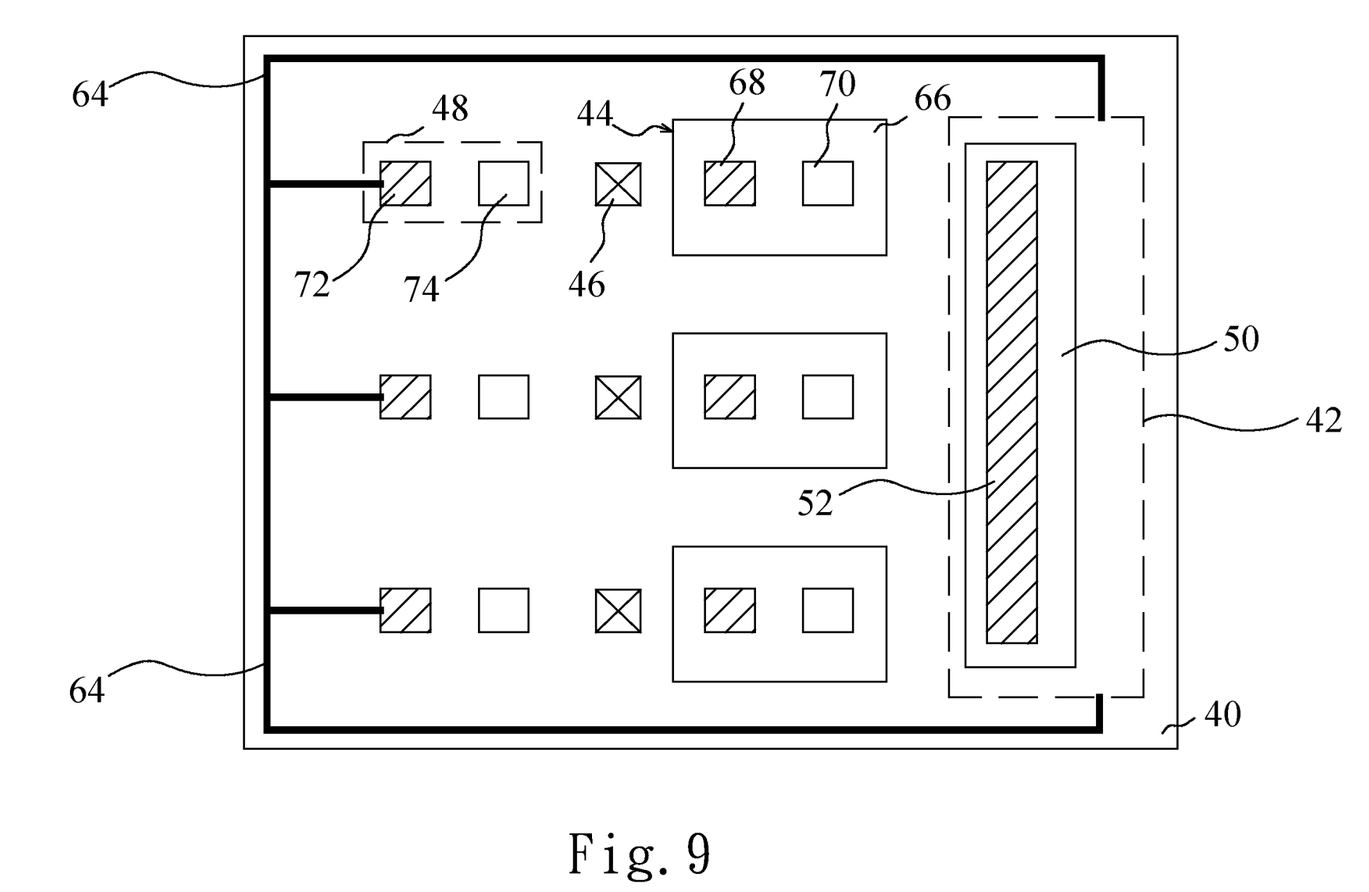
FIG. 9 is a layout schematically showing an improved transient voltage suppression device according to the fourth embodiment of the present invention.

Refer to FIG. 9. The fourth embodiment of the improved transient voltage suppression device of the present invention is introduced as follows. The fourth embodiment is different from the second embodiment in the numbers of the first diode 44, the conductive pad 46, and the second diode 48. In the third embodiment, there are a plurality of first diodes 44, a plurality of conductive pads 46, and a plurality of second diodes 48. Besides, the position of one of the plurality of conductive pads 46 corresponds to the positions of one of the plurality of first diodes 44 and one of the plurality of second diodes 48. Each of the plurality of second diodes 48 is electrically connected with the power buses 64.

In conclusion, the present invention uses the second diode to separate the first diode from the transient voltage suppressor without using a guard ring, thereby reducing the layout area, increasing the latch-up path and avoiding the latch-up event.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An improved transient voltage suppression device comprising:
   a semiconductor substrate;
   a transient voltage suppressor formed in the semiconductor substrate, the transient voltage suppressor has a P-type clamping region and an N-type heavily-doped clamping area therein, and the N-type heavily-doped clamping area is grounded;
   at least one first diode formed in the semiconductor substrate, a first anode of the at least one first diode is grounded and electrically to connected to the N-type heavily-doped clamping area, and the first anode is a first shortest distance from the N-type heavily-doped clamping area;
   at least one conductive pad is formed on the semiconductor substrate and electrically connected to a first cathode of the at least one first diode, the at least one conductive pad is a second shortest distance from the N-type heavily-doped clamping area, and the second shortest distance is larger than the first shortest distance; and
   at least one second diode formed in the semiconductor substrate, a second anode of the at least one second diode is electrically connected to the at least one conductive pad, a second cathode of the at least one second diode is electrically connected to the transient voltage suppressor, the second anode is a third shortest distance from the N-type heavily-doped clamping area, and the third shortest distance is larger than the second shortest distance.

2. The improved transient voltage suppression device according to claim 1, wherein the semiconductor substrate is an N-type substrate.

3. The improved transient voltage suppression device according to claim 2, wherein the at least one first diode further comprises:
   a P-type well formed in the semiconductor substrate;
   a first N-type heavily-doped area formed in the P-type well and used as the first cathode; and
   a first P-type heavily-doped area formed in the P-type well and used as the first anode.

4. The improved transient voltage suppression device according to claim 3, wherein the at least one second diode further comprises:
   a second N-type heavily-doped area formed in the semiconductor substrate and used as the second cathode; and
   a second P-type heavily-doped area formed in the semiconductor substrate and used as the second anode.

5. The improved transient voltage suppression device according to claim 4, wherein the P-type clamping region is a P-type well.

6. The improved transient voltage suppression device according to claim 1, wherein the semiconductor substrate is a P-type substrate and a part of the semiconductor substrate is used as the P-type clamping region.

7. The improved transient voltage suppression device according to claim 6, wherein the at least one first diode further comprises:
   a first N-type heavily-doped area formed in the semiconductor substrate and used as the first cathode; and
   a first P-type heavily-doped area formed in the semiconductor substrate and used as the first anode.

8. The improved transient voltage suppression device according to claim 7, wherein the at least one second diode further comprises:
   an N-type well formed in the semiconductor substrate;
   a second N-type heavily-doped area formed in the N-type well and used as the second cathode; and
   a second P-type heavily-doped area formed in the N-type well and used as the second anode.

9. The improved transient voltage suppression device according to claim 1, wherein the second cathode is electrically connected to the transient voltage suppressor through two power buses and the power buses are arranged along a perimeter of the semiconductor substrate.

10. The improved transient voltage suppression device according to claim 9, wherein each of the power buses has a width of at least 20 μm.

11. The improved transient voltage suppression device according to claim 1, wherein the at least one first diode further comprises a plurality of first diodes, the at least one second diode further comprises a plurality of second diodes, the at least one conductive pad further comprises a plurality of conductive pads, and a position of one of the plurality of conductive pads corresponds to positions of one of the plurality of first diodes and one of the plurality of second diodes.

12. The improved transient voltage suppression device according to claim 1, wherein the transient voltage suppressor is a silicon-controlled rectifier (SCR) or a bipolar junction transistor (BJT).

* * * * *